United States Patent [19]

Hsioh-Lien Ma

[11] 4,187,331

[45] Feb. 5, 1980

[54] FLUORINE PLASMA RESIST IMAGE HARDENING

[75] Inventor: William Hsioh-Lien Ma, Wappingers Falls, N.Y.

[73] Assignee: International Business Machines Corp., Armonk, N.Y.

[21] Appl. No.: 936,425

[22] Filed: Aug. 24, 1978

[51] Int. Cl.² .............................. B05D 3/06
[52] U.S. Cl. ................. 430/328; 427/385 R; 427/41; 430/330; 430/317
[58] Field of Search ............. 427/38, 39, 40, 41, 427/43, 385 R; 96/35.1, 36.2

[56] References Cited

U.S. PATENT DOCUMENTS

| | | | |
|---|---|---|---|
| T883,005 | 2/1971 | Schuller et al. | 96/36.2 |
| 3,402,073 | 9/1968 | Pierce et al. | 427/41 |
| 3,674,667 | 7/1972 | Manion et al. | 204/165 |
| 3,687,832 | 8/1972 | Fydelor et al. | 204/165 |
| 3,816,196 | 6/1974 | LaCombe | 156/634 |
| 3,867,216 | 2/1975 | Jacob | 156/634 |
| 3,879,597 | 4/1975 | Bersin et al. | 219/121 P |
| 3,920,483 | 11/1975 | Johnson et al. | 148/1.5 |
| 4,018,945 | 4/1977 | Mehalso | 427/41 |
| 4,068,018 | 1/1978 | Hashimoto et al. | 427/38 |
| 4,125,650 | 11/1978 | Chiu et al. | 427/43 |

OTHER PUBLICATIONS

IBM TDB V19, No. 3, p. 859, Aug. 1976; V14, No. 10, p. 2899, Mar. 1972; V17, No. 1, p. 85, Jun. 1974; V19, No. 4, p. 1400, Sep. 1976; V21, No. 7, p. 2824, Dec. 1978.

Bersin, "Adhesives Age," Mar. 1972, pp. 37–40.

Yasuda, "Journ. Polymer Sci.," Polymer Chem. Ed., vol. 15, pp. 2411-2425, 1977.

*Primary Examiner*—John H. Newsome
*Attorney, Agent, or Firm*—David M. Bunnell

[57] ABSTRACT

An organic polymer resist image layer, formed on a substrate, is stabilized by placing the substrate with the resist image layer in an electrodeless glow discharge in a low pressure fluorine containing atmosphere, for example, $CF_4$, so as to harden the exposed surface of the layer and then heating the layer.

10 Claims, No Drawings

FLUORINE PLASMA RESIST IMAGE HARDENING

BACKGROUND OF THE INVENTION

The invention is directed generally to a process for stabilizing organic resist image layers and more particularly to the treatment of such layers with a fluorine containing plasma and then baking.

Many microimaging processes such as, for example, integrated circuit fabrication require high temperatures. However, the upper limit of the processing temperature is often restricted by the resist masking material properties. The deformation of the resist image during high temperature baking (and especially for temperatures greater than about 200° C.) also places a constraint on the minimum image size of the resist mask pattern and hence the product geometry. Organic polymer resist image layers are conventionally baked after development in order to improve resist adhesion and the physical properties of the resist. Baking is necessary so that the resist will withstand the chemicals used to etch the substrate and/or high temperature treatment such as metal deposition without separating from the substrate or being subject to image distorting flow. The problem of flow is particularly important in microimaging processes such as integrated circuit manufacture where dimensions are becoming smaller as the technology advances and very fine lines must be preserved. The resist layer is baked to at least a temperature to which it is expected to be subjected during substrate processing. The baking process is itself limited to times and temperatures where image distortion due to flow is minimized. Where the permissible baking conditions are insufficient to provide the needed resist properties, then an alternate technique of improving resist stability must be used.

Previous techniques for improving resist image stability have included bombardment of the resist image by placing the image bearing substrate in a glow discharge on an electrode with an inert gas atmosphere such as argon, nitrogen, or mixtures of nitrogen and hydrogen as described in, for example, Defensive Publication No. T883,005, dated Feb. 2, 1971. Treatment of resist images in a glow discharge with oxygen is described for example in U.S. Pat. Nos. 3,816,196 and 3,920,483. Where the resist image bearing substrates are placed in a plasma on an electrode such as, for example in the process described in T883,005 and subjected to ion bombardment, by choosing the correct conditions, stability of the resist layers to high temperatures can be achieved. However, in an electrodeless plasma treatment with oxygen or an inert gas, it has been found that resist image stability to temperatures of only up to about 210° C. can be provided. Where temperatures above this must be withstood, and it is undesirable or inconvenient to use a treatment involving ion bombardment of the resist layer and substrate, there was a need for an improved electrodeless plasma treatment. It has unexpectedly been found that a short electrodeless glow discharge treatment using a fluorine containing atmosphere permits the heating or baking of the resist layer to temperatures of at least about 330° C. to thereby provide resist image stability during processing at very high temperatures.

BRIEF SUMMARY OF THE INVENTION

In accordance with the invention, a process for stabilizing an organic polymer resist image layer formed on a substrate is provided. The resist image layer bearing substrate is placed in an electrodeless glow discharge in a low pressure, fluorine containing atmosphere so as to harden the exposed surface of the layer and then the layer is heated.

DETAILED DESCRIPTION

Electrodeless glow discharge or "barrel" reactors suitable for the practice of the process of the invention are commercially available. For example, inductively coupled RF discharge reactors marketed by the LFE Corporation or capacitively coupled reactors marketed by the International Plasma Corporation. The reactors include an electrode or electrodes connected to a source of RF power. Between the electrodes is a glass chamber in which the sample to be treated is placed. The chamber has an outlet connected to a vacuum pump to provide a reduced pressure in the chamber and a gas inlet and flow control for introducing the required atmosphere into the chamber.

The pressure and power parameters suitable for the operation of the process of the invention are generally those which provide a stable glow discharge sufficient to give resist hardening without loss of resist. Suitable pressures range from about 0.1 to 1.5 torr (100 microns to 1500 microns of Hg) and the power, ranges from about 25 to 500 watts. The treatment times to give suitable results can be very short and generally range from about 15 seconds to 15 minutes. Preferred are times of about 15 seconds to about 3 minutes with the minimum time being necessary to obtain suitable hardening. Times longer than a few minutes can be used but are unnecessary. Surprisingly, it was found that the profile of the resist image sidewalls could be altered without changing the image dimensions of the pattern in contact with the substrate by varying the time of the treatment. With short times of 15 to 30 seconds straight sidewalls were retained after resist baking. Such an image is desirable in order to obtain the lowest possible etch bias or to preserve a metal lift-off lip or overhang profile. With longer times, about 2 minutes, a rounding of the resist image profile can be obtained which, due to replication of a resist profile upon plasma etching of the substrate, permits the obtaining of a resist image layer which will produce tapered sidewalls in the substrates. Such a profile is desirable, for example, when etching via holes in quartz during integrated circuit manufacture so that sharp quartz edges at the top are avoided and good metal coverage can be obtained. The reason for the rounding phenomenon is not completely understood but it is believed that the longer times provide a thicker skin on the resist image which acts to trap residual solvent in the resist layer and causes the rounding upon heating. Such solvent escapes through the skin formed by the shorter process times.

Suitable compounds for forming the atmosphere in the chamber for image hardening must contain fluorine. Preferred are organic fluorine compounds having 1 to 3 carbon atoms for example $CF_4$, $C_2F_6$, $C_3F_8$, $CBrF_3$, $CCl_2F_2$, $CHClF_2$ and $CHF_3$.

Also $SF_6$ can be used as well as mixtures of the above. Other gasses such as the noble gasses, nitrogen or reactive gasses such as air or oxygen can also be present but are unnecessary to the operation of the process of the invention.

Either positive or negative acting resist materials can be hardened by the process of the invention. Such materials are radiation, e.g. light, electron beam or x-ray sensitive organic polymeric materials which form image patterns upon exposure and development. Resist films that insolubilize when exposed to radiation are denoted as negative resists. The unexposed film is developed (dissolved away by a developer) to leave uncovered areas of substrate surface. Conversely, resist films which solubilize after exposure to radiation are termed positive resists. Typical examples of positive resists are diazo ketone activated phenol formaldehyde novolak resins such as are marketed by the Shipley Company as Shipley AZ1350 and AZ111 resists. Examples of negative resists are azide sensitized polycyclize, poly-cis-isoprene polymers such as are marketed by Kodak as Kodak KTFR resists.

The process of the invention is further illustrated by but is not intended to be limited to the following examples.

EXAMPLE 1

A single layer resist image metal lift-off structure was formed on the oxidized surface of sample silicon semiconductor wafers. About a 20,000 angstrom thick layer of resist which comprised a meta-cresol formaldehyde novolak resin and a diazo ketone sensitizer which comprised mixed 2-diazo-1-oxo-naphthalene-5-sulfonic acid esters of 2,3,4-trihydroxybenzophenone in a proportion of about 75% by weight polymer and 25% by weight sensitizer was spin coated from a solvent solution and then exposed to the desired pattern with ultraviolet light. The exposed layers were soaked in chlorobenzene for a few minutes and then developed in a mild alkaline developer to remove the exposed portions of the layers. The chlorine treatment provides an overhanging lip at the top of the resist layer whose function is to create an area of discontinuity between the portions of metal film which are formed on the substrate and the portions of the metal film which are formed on the top of the resist layer. This permits the latter portions to be lifted off with the resist to leave the desired metal pattern on the substrate. The lip must be preserved during any resist post bake or hot metal evaporation processes. The developed samples were placed in an IPC plasma reactor and treated in a glow discharge at a pressure of about 500 microns of Hg and a power of 25 watts for 30 seconds with atmospheres of $CF_4$ or $CF_4$ containing about 8% by volume of oxygen. Following the treatment, the samples were placed on a hotplate in a nitrogen atmosphere and baked at 330° C. for 20 minutes. An examination of the cross-section of the resist image, with scanning electron microscopy, following the baking showed that the resist overhang was preserved even after the high temperature bake. Other samples with a developed lift-off structure as described above were plasma treated in oxygen, nitrogen, and argon under the same conditions and other conditions of time, pressure and power to try to obtain optimum results but in all cases such treatments did not prevent the flow of the resist and loss of the overhang or lip when baked at temperatures of above 210° C.

EXAMPLE 2

In ion implantation processes to form active areas in the surface of silicon semiconductor materials through a resist mask, it is necessary that a vertical resist image profile be maintained. Rounding of the resist profile due to heating and flow of the resist during ion implantation would cause the resist to become thin at the edges of the images in contact with the substrate. A lateral, ion implanted, doped profile would result due to penetration of the ions through the thin resist portions. Where closely spaced active areas are to be formed in highly integrated structures this lateral doping can cause one device area to overlap another and destroy the device. Also, it has been found that during ion implantation the outgassing of residual solvent or other materials from an untreated resist layer causes bubbles in the resist to form. Where these bubbles occur around a device area the device can be destroyed during the ion implantation process. Sample silicon semiconductor wafers were coated with 1 micron thick layer of positive Shipley AZ1350J resist, having the composition described in Example 1, and exposed and developed to form a pattern for the ion implantation of arsenic into the surface of the silicon semiconductor wafer. The developed, resist bearing substrates were then placed in the plasma reactor and treated at a pressure of about 500 microns of Hg with 25 watts power for from 15 to 30 seconds in an atmosphere of $CF_4$ containing about 8% by volume of oxygen. Different samples were then baked at either 330° C. for 20 minutes for 300° C. for 30 minutes on a hotplate in a nitrogen atmosphere and then were subjected to a 50 KeV at 4 Ma power arsenic ion implantation. An examination by electron microscopy before and after the ion implantation treatment indicated no resist profile degradation and the resist could be stripped from the substrate with no detectable residue.

In contrast, samples which were not subjected to plasma hardening or were subjected to an oxygen plasma treatment were not stable at temperatures above about 210° C. and, with the untreated samples, bubbling of the resist layer occurred.

EXAMPLE 3

Sample silicon wafers having a oxidized surface were coated with a 2 micron thick layer of a positive resist comprising a phenolformaldehyde novolak resin sensitized with a 2-diazo 1-oxo-naphthalene-5-sulfonic acid ester of 2,4-dihydroxybenzophenone and exposed to ultraviolet radiation to form a pattern which was developed with a mild alkaline developer. The developed samples were then placed in an International Corp. Model 1813 etcher/stripper and treated with an atmosphere of $CF_4$ plus about 8% by volume oxygen at a power of 25 watts at a pressure of 0.5 torr for 2 minutes after which the samples were baked in a nitrogen atmosphere at 210° C. for 30 minutes. After baking, the dimensions of the resist openings were not changed but instead of being rectangular in cross-section, electron microscope photographs showed that the cross-section was almost semi-circular. The baking step thus automatically produced a desired tailored resist profile which was stable at high temperatures (above 300° C.). When the oxide was plasma etched, the resist profile was replicated in the oxide layer to give openings in the oxide layer with rounded rather than sharp edges at the top so that the oxide could be readily covered without breaks by a vapor deposited metal layer.

EXAMPLE 4

Resist coated wafers were exposed and developed following the procedure of Example 3. The developed samples were treated in plasmas at a pressure of 0.5 torr and a power of 50 watts for 30 seconds with atmospheres of either $CBrF_3$, $C_2F_6$, $CCl_2F_2$ or $CHClF_2$. The samples were then treated at 210° C. for 20 minutes. In each case the resist image was preserved by the plasma hardening treatment.

The foregoing has described a resist image hardening process which provides temperature stability to very high temperatures of above 300° C. while employing an electrodeless plasma discharge.

Having thus described our invention, what we claim as new, and desire to secure by Letters Patent is:

1. A process for stabilizing an organic polymer resist image layer formed on a substrate comprising placing the image layer bearing substrate in an electrodeless glow discharge in a low pressure fluorine containing atmosphere so as to harden the exposed surface of said layer and then heating said layer.

2. The process of claim 1 wherein the heating is at a temperature of at least about 210° C.

3. The process of claim 1 wherein the heating is at a temperature of from about 210° to 330° C.

4. The process of claim 1 wherein the fluorine containing atmosphere is formed from a compound selected from the group consisting of a fluorine substituted organic compound having from 1 to 3 carbon atoms and $SF_6$.

5. The process of claim 1 wherein the image layer bearing substrate is subjected to the glow discharge for from about 15 seconds to about 15 minutes.

6. The process of claim 5 wherein the time is from about 15 to 30 seconds.

7. The process of claim 5 wherein the time is at least about 2 minutes so as to provide a rounded resist profile upon heating said layer.

8. The process of claim 1 wherein the pressure ranges from about 0.1 to 1.5 torr and the power ranges from about 25 to 500 watts.

9. The process of claim 1 wherein the resist image layer has a lift-off profile having an overhanging lip at the top of the resist layer.

10. The process of claim 1 wherein the fluorine containing atmosphere includes $CF_4$ the pressure is about 0.5 torr and the power is about 25 watts and the treatment time is from about 15 seconds to 2 minutes.

* * * * *